United States Patent [19]
Sager et al.

[11] Patent Number: 5,343,147
[45] Date of Patent: Aug. 30, 1994

[54] METHOD AND APPARATUS FOR USING STOCHASTIC EXCITATION AND A SUPERCONDUCTING QUANTUM INTERFERENCE DEVICE (SAUID) TO PERFORM WIDEBAND FREQUENCY RESPONSE MEASUREMENTS

[75] Inventors: Ronald E. Sager, Carlsbad; Michael B. Simmonds, Del Mar, both of Calif.

[73] Assignee: Quantum Magnetics, Inc., San Diego, Calif.

[21] Appl. No.: 941,527

[22] Filed: Sep. 8, 1992

[51] Int. Cl.$^5$ .................. G01R 33/12; G01R 33/035; G01R 33/46
[52] U.S. Cl. .................. 324/239; 324/224; 324/318; 324/248; 505/846; 307/306
[58] Field of Search .............. 324/201, 202, 205, 239, 324/243, 248, 260, 261, 262, 301, 302, 71.6, 318; 307/306; 505/841–846, 702, 705; 338/325, 224, 259

[56] References Cited

U.S. PATENT DOCUMENTS

| | | | |
|---|---|---|---|
| 4,489,274 | 12/1984 | Berlincourt | 324/248 |
| 4,549,135 | 10/1985 | Vaidya | 324/248 |
| 4,567,438 | 1/1986 | Gershenson et al. | 324/248 |
| 4,588,947 | 5/1986 | Ketchen | 324/201 |
| 4,749,946 | 6/1988 | Hoenig | 324/248 |
| 4,864,237 | 9/1989 | Hoenig | 324/248 |
| 4,875,010 | 10/1989 | Yokosawa et al. | 324/248 |
| 4,923,850 | 5/1990 | Stephan et al. | 324/248 X |
| 5,004,724 | 4/1991 | De | 505/1 |
| 5,004,726 | 4/1991 | Shaulou et al. | 324/201 X |
| 5,021,739 | 4/1991 | Yokosawa et al. | 324/248 |
| 5,073,858 | 12/1991 | Mills | 324/201 X |
| 5,095,270 | 3/1992 | Ludeke | 324/248 |
| 5,162,731 | 11/1992 | Fujimaki | 324/248 |

OTHER PUBLICATIONS

Blumich, White Noise Nonlinear System Analysis in NMR Spectroscopy, Progress in NMR Spectroscopy, vol. 19, pp. 331–417 (1987).
Kaiser, Coherent Spectometry with Noise Signals, J. of Magnetic Resonance 3, 28–43 (1970).
Giffard et al., Principles and Methods . . . Point-Contact Superconducting Device, J. of Low Temp. Physics, vol. 6, No. 5/6 pp. 553–611 (1972).
Wong et al., Discrete Analysis of Stochastic NMR, J. of Magnetic Resonance 87, 242–264 (1990).
Bendat et al, "Random Data: Analysis and Measurement Procedures", *Wiley Interscience*, (no month) Copyright 1971, pp. 9–11.

*Primary Examiner*—Gerard R. Strecker
*Assistant Examiner*—Warren S. Edmonds
*Attorney, Agent, or Firm*—Baker, Maxham, Jester & Meador

[57] ABSTRACT

A stochastic excitation, SQUID detection system for determining the frequency response of a sample. A pair of counterwound detection coils are adjacent to an excitation coil. The sample is selectively placed in one of the detection coils for taking measurements. The SQUID sensor is a broadband, high sensitivity device which enables the frequency response of the sample to be determined over a wide bandwidth with a single measurement.

15 Claims, 3 Drawing Sheets

METHOD AND APPARATUS FOR USING STOCHASTIC EXCITATION AND A SUPERCONDUCTING QUANTUM INTERFERENCE DEVICE (SAUID) TO PERFORM WIDEBAND FREQUENCY RESPONSE MEASUREMENTS

FIELD OF THE INVENTION

This invention relates generally to SQUID detection systems and more particularly to such a detection system having a very large bandwidth and very large dynamic range to detect the response of a material sample or a system when stochastic excitation is applied to the sample.

BACKGROUND OF THE INVENTION

In many response measurements, a high-power pulse or series of pulses having a well-defined frequency is applied to a material sample and the sample response is then measured at that specific frequency after the pulses have been turned off, using a detector which resonates at the same frequency.

In the technique of stochastic nuclear magnetic resonance (NMR), which was invented many years ago, a random or pseudorandom (stochastic) radio frequency signal or pulse stream is applied to a sample and the sample response is detected by a high-Q input circuit, tuned to the specific frequency of interest and connected to a high sensitivity detection amplifier. Such detection systems achieved their sensitivity by using a high-Q detection circuit which has a bandwidth, B, limited by the nature of the high-Q circuit, and determined from the equation:

$$Q = \frac{f_o}{B} \qquad \text{(Eq. 1)}$$

In these detection systems, the sample is driven with a very wide range of frequencies in the stochastic excitation signal but the detection system operates with high sensitivity only within the relatively narrow bandwidth, B, determined by the Q of the input circuit. In addition, when this type of detection system is exposed to the stochastic excitation signal, the input amplifier usually saturates, so the normal implementation uses a series of stochastic pulses (having random amplitudes and phases) to excite the sample, and the detection system is used to measure the sample response between the pulses.

SUMMARY OF THE INVENTION

The present invention addresses both of the problems mentioned above, that is, the limited bandwidth of high sensitivity as it is determined by the Q of the input circuit, and the likelihood of the input amplifier saturating when the detection system is exposed to a stochastic excitation signal. Broadly speaking, the invention provides a unique matching of a SQUID detection system with the inherent nature of a stochastic excitation signal in making wideband frequency response measurements.

In accordance with the invention, a SQUID detector which utilizes superconducting input coils can have an effective bandwidth from DC to more than 100 MHz and its sensitivity is independent of frequency over its entire bandwidth above about 0.1 Hz. A result is that the SQUID detector is an ideal detection device for stochastic measurements because it can detect all frequencies from the stochastically driven sample with equal sensitivity. Consequently, to characterize the frequency response of a sample, instead of making a long series of measurements with each measurement covering only a narrow range of frequencies, as was true of the prior art, the present invention allows a single measurement to characterize the sample over a large range of frequencies.

In its basic implementation, a stochastic signal source (which may generate either random noise or a pseudo-random but deterministic excitation signal) feeds its signal to a stochastic excitation coil. Counterwound detection coils are adjacent to the excitation coil, and the sample, the frequency response of which is to be measured, is placed in that stochastic magnetic field within one of the detection coils. The detection coils are connected to a superconducting input coil. A SQUID detector is within the magnetic field of the input coil. A modulation output coil is within equivalent magnetic field range of the SQUID and provides the output signals of the measurement system. The combination of the SQUID input and output coils, together with the SQUID, is a conventional SQUID sensor package.

In alternative embodiments, a DC magnetic field may also be applied to the sample. The level of the DC magnetic field is selectively variable so that by performing successive measurements with different fields, the frequency response of the sample can be measured as a function of the magnetic field. Alternatively, the temperature of the sample may be varied so that successive measurements can be performed to determine the frequency response as a function of temperature.

BRIEF DESCRIPTION OF THE DRAWING

The objects, advantages and features of this invention will be more clearly perceived from the following detailed description, when read in conjunction with the accompanying drawing, in which.

DESCRIPTION OF THE PREFERRED EMBODIMENTS

A sample, which may be any substance, compound or element, or systems such as an integrated circuit, may resonate at a particular frequency, that frequency being a physical characteristic of the sample. An internal circuit of the sample may have a self resonant frequency. Nuclear magnetic resonance measurements have been used to characterize the magnetic behavior of materials or systems. These samples respond at their characteristic frequency to an applied broadband noise. The measurement system of this invention basically comprises coupling a wideband excitation with an equally wideband detection system in order to make the measurements of the sample and to thereby determine its characteristic response and to identify anomalies. The term "sample" is employed herein to refer to either a sample or a system as defined above.

Figure 1:
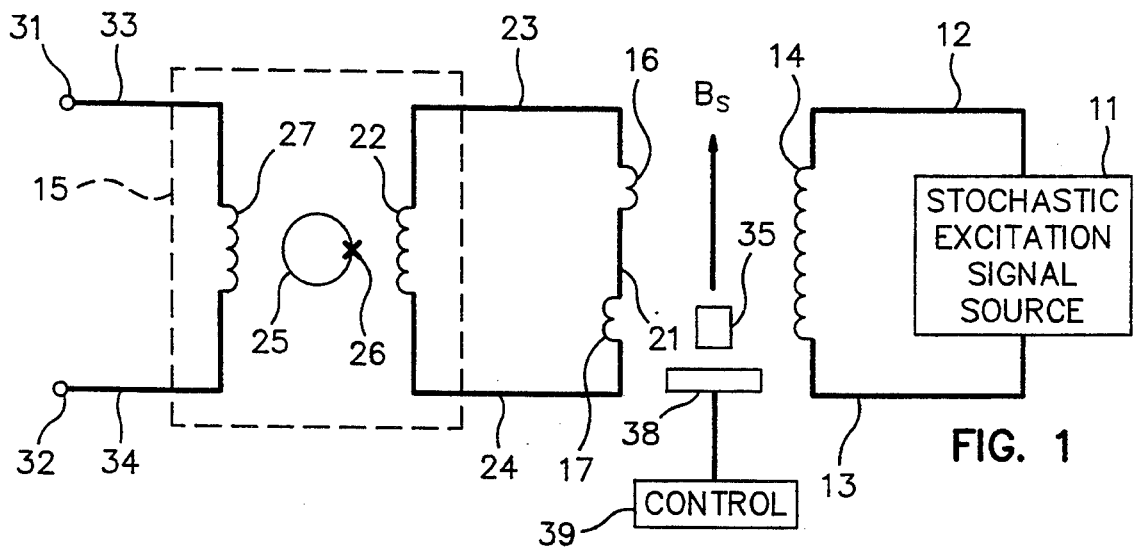
FIG. 1 is a schematic diagram of a basic embodiment of this invention.

With reference now to the drawing and more particularly to FIG. 1, there is shown white noise or stochastic excitation source 11 connected by means of conductors 12 and 13 to stochastic excitation coil 14. For reference purposes, an excitation signal which has a white noise frequency spectrum is referred to as stochastic excitation. This combination of elements may be referred to as the excitation circuit.

For this invention, the stochastic excitation signal may be generated as a non-deterministic random signal which is white over the bandwidth of interest. Alternatively, the stochastic excitation signal may be a deterministic signal (either having been measured or having been generated by a known algorithm), which may later be used to compute the cross-correlation function between the stochastic excitation signal and the SQUID output signal.

The measurement circuit comprises a typical SQUID sensor package 15 connected to superconducting detection coils 16 and 17 which are interconnected by conductor 21. The detection coils are connected to SQUID input coil 22 by means of conductors 23 and 24. The entire SQUID sensor package is at a cryogenic temperature so input coil 22 is a superconducting element. SQUID 25 includes Josephson junction 26 which functions in known manner. Output or modulation coil 27 is also a superconducting coil and is connected to output terminals 31 and 32 by means of conductors 33 and 34.

The sample to be measured and is characterized referred to by reference numeral 35 and is shown schematically between excitation coil 14 and detection coil 17. In actual practice the sample will be placed in one of coil 16 or 17 for measurement purposes. In operation, initially the two detection coils, which are connected in series and are counterwound with respect to each other, are balanced with respect to the excitation coil so that when no sample is present, a signal from the excitation coil pursuant to input from the stochastic signal source, produces little or no signal in the detector, that is, at output terminals 31 and 32, other than a similar white noise.

The physical configuration of the detection coils and excitation coil may depend upon the specific measurement to be performed. For example, the detection coils and excitation coil might be wound as coaxial solenoidal coils for measurements of AC magnetic susceptibility. They may be wound orthogonally for measurements of nuclear magnetic resonance. Other configurations may be useful for different types of measurements.

For the initial measurement, the sample is placed in one of the detection coils and a stochastic magnetic field is applied to the sample by excitation coil 14. Since the excitation signal produces a stochastic signal for example, white noise, in the detector, and the detector noise is itself stochastic, any deviation from stochastic noise in the detected signal can be attributed to the sample. When using a deterministic excitation signal and computing the cross-correlation function between the excitation signal and the detected signal, the signal from the sample can be confirmed by moving it from one detection coil to the other. When this is done, the signal from the sample itself will change in sign while all signals from other sources will remain constant, resulting in a detectable change in the cross-correlation function.

The power of this invention can be further enhanced by using the well known techniques of computing the cross-correlation function between a random but deterministic input signal and the detected output signal. Performing the measurement with no sample in the detection coils provides a direct determination of the SQUID response. Repeating the measurement with a sample in one of the detection coils provides a similar measurement of the system response including any effect from the sample. Hence, the sample response can be deduced from the change in the cross-correlation function with and without the sample present.

Figure 2:
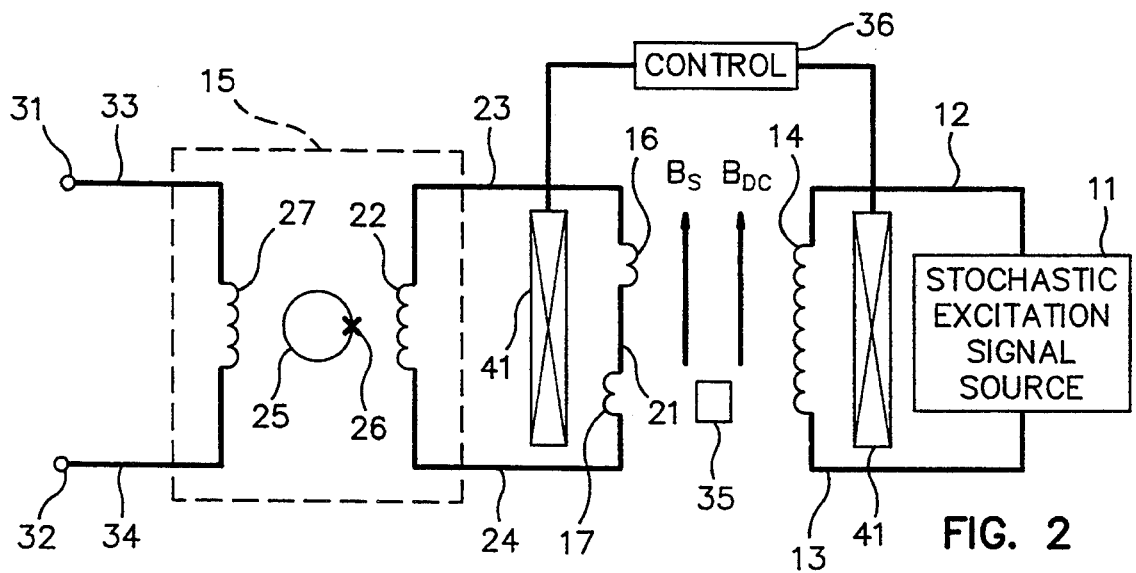
FIG. 2 shows the embodiment of FIG. 1 with the addition of a DC magnetic field applied along the direction of the excitation field.

A further enhancement and alternative embodiment of the technique of FIG. 1 is shown in FIG. 2 where an additional electrical solenoid 41 is employed to apply a DC magnetic field, $B_{DC}$ (parallel to the stochastic excitation field, $B_s$), to the sample while the stochastic measurements are being performed. By performing successive measurements in different field strengths (as might be changed by control 36), the frequency response of the sample can then be measured as a function of the magnetic field. For example, the configuration of FIG. 2 could be used to measure the AC magnetic susceptibility of the sample over the available range of DC magnetic fields and over the entire frequency range available from the bandwidths of the stochastic excitation signal and SQUID detection system.

Figure 3:
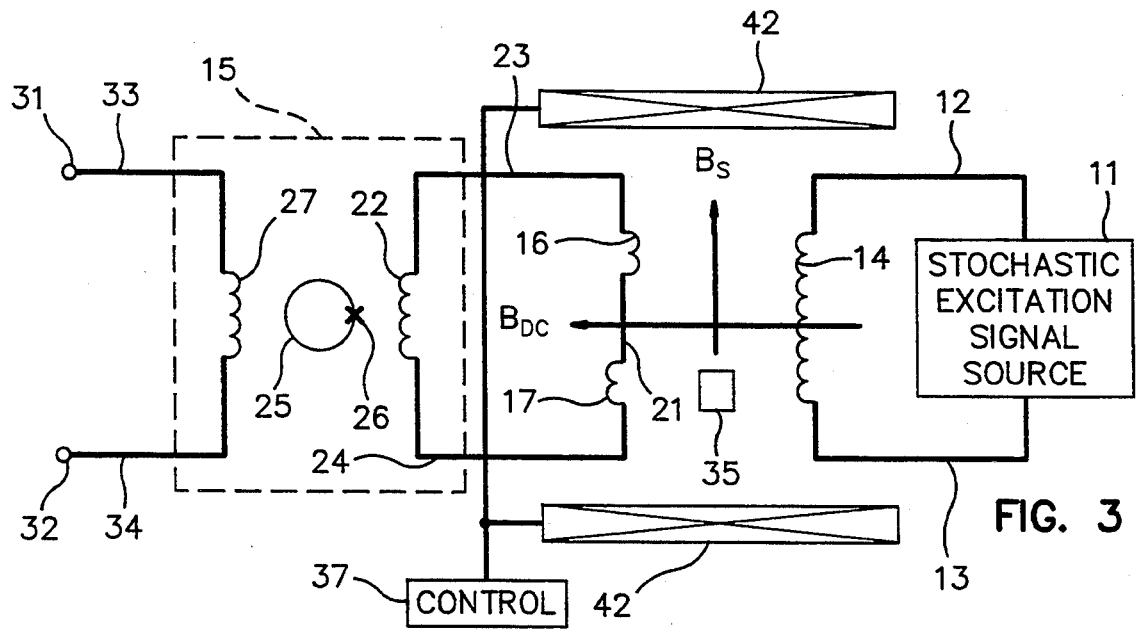
FIG. 3 is an alternative embodiment similar to FIG. 2 showing the addition of the DC magnetic field perpendicular to the direction of the excitation field.

Another embodiment is shown in FIG. 3 where the additional solenoid coil, similar to that of FIG. 2, is oriented such that the direction of the DC magnetic field, $B_{DC}$, is perpendicular to the direction of the stochastic excitation field $B_S$. In this configuration the system could be used to perform measurements of nuclear magnetic resonance with the field strength variations being changed by control 37.

Figure 7:
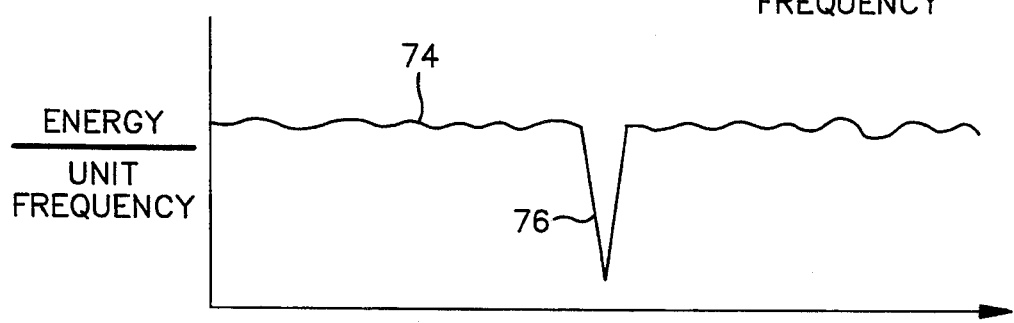
FIG. 7 is the graphic representation of FIG. 6 with a sample in one of the detector coils.

An example of the signal indicating a characteristic of a sample analyzed in accordance with the invention is shown in FIG. 7. When the DC bias of either FIG. 2 or FIG. 3 is applied a shift in frequency may occur, or the signal peak may split into more than one peak, as shown by peaks 77 and 81 in FIG. 8. These graphical representations will be discussed in more detail later.

In these configurations, the stochastic excitation field can be used to excite all of the sample's magnetic resonances which fall within its bandwidth, and which can then be detected by the wideband SQUID detection system. This innovation offers a significant improvement over the stochastic NMR measurements using narrow band detection systems in that all of the nuclear magnetic resonances can be detected simultaneously and with a high sensitivity by the SQUID detection system.

Figure 4:
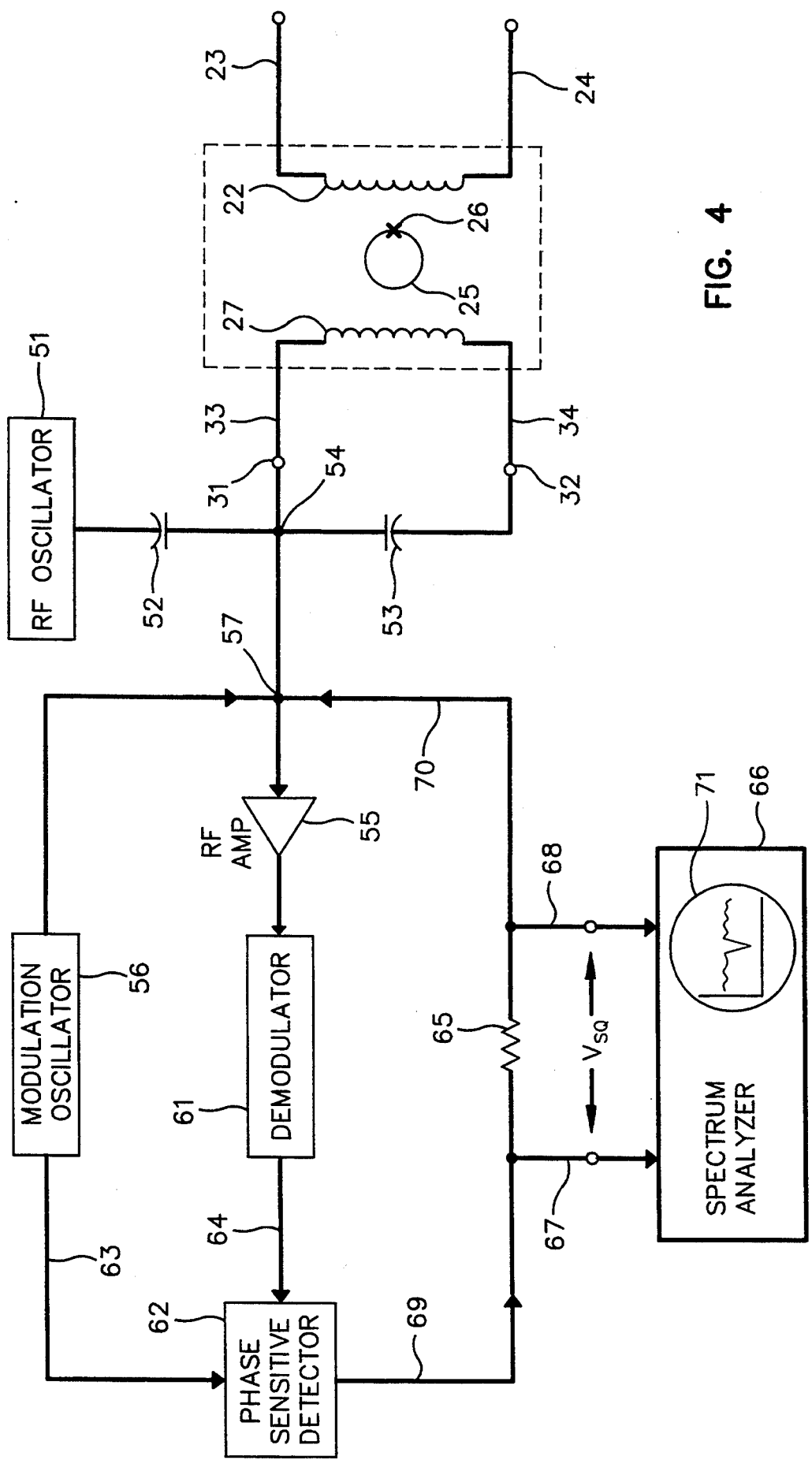
FIG. 4 is a schematic representation of a system in which the detection system of any of FIGS. 1-3 is employed to analyze samples.
Figure 5:
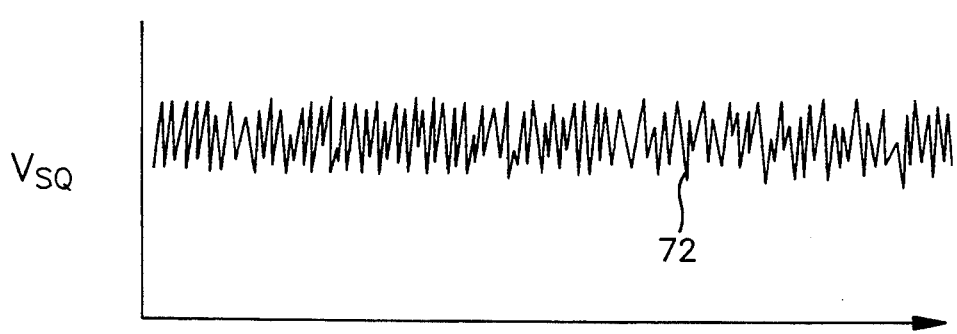
FIG. 5 is a graphic representation of the broadband noise applied to the detection system and is the output of the SQUID detector.
Figure 6:
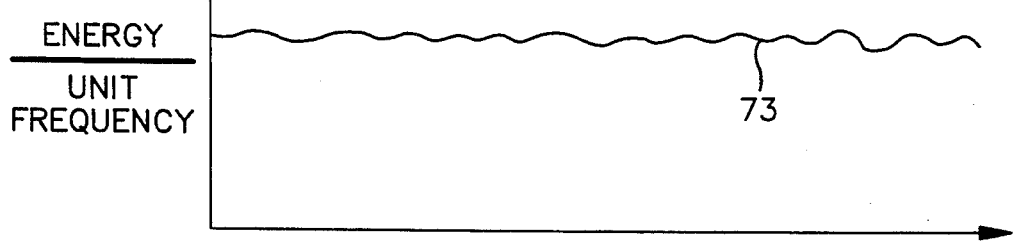
FIG. 6 is a graphic representation of the SQUID output without a sample and after applying a Fourier Transform.

There are several ways in which the SQUID output may be handled electronically in order to provide the desired information about the sample. An example of a circuit which acts on the output of the detector of any one of FIGS. 1–3 and provides useful indications of the characteristic magnetic behavior of the sample, is shown in FIG. 4. The sensor circuitry of FIGS. 1–3 is connected to the FIG. 4 circuitry at terminals 31 and 32. Capacitor 53, together with the inductance of SQUID output coil 27, creates a tank circuit which, for purposes of this exemplary embodiment, oscillates at 180 MHz. RF oscillator 51 provides energy to the tank circuit by weakly coupling to it a 180 MHz signal through capacitor 52. The combined signal is presented to wideband RF amplifier 55. In this example, modulation oscillator 56 provides a 200 KHz signal. This signal modulates the SQUID signal through SQUID inductor 27, thereby modulating the flux in the SQUID loop to vary the amplitude of the 180 MHz signal. Thus this 200 KHz modulated 180 MHz signal appears at the output from the RF amplifier and at the input to demodulator 61. The demodulator removes the 180 MHz signal so that its output to phase sensitive detector 62 is the 200 KHz amplitude modulated envelope. Another input to detector 62 is a reference 200 KHz signal from oscillator 56 through line 63.

The output of the phase sensitive detector is proportional to the amplitude of the 200 KHz signal from the demodulator. The demodulator output on line 69 is a DC voltage which varies in amplitude as a low frequency, wideband signal having a varying rate between zero and 50 KHz. That detector output signal is applied to feedback resistor 65 to create a voltage across it and a current which is applied back to SQUID inductor 27 through line 70. This drives the amplitude of the 200 KHz signal from the SQUID to zero. Because of the tank circuit operation, it holds the SQUID in a state in which the 200 KHz signal in the tank circuit has a zero amplitude. This circuitry loop, which includes the SQUID, is often referred to as a flux locked loop.

When a signal is applied to the SQUID, pursuant to a sample being placed in one of detection coils 16 and 17, the net result is an additional voltage which appears across resistor 65. The voltage across feedback resistor 65 constitutes the output voltage of the SQUID sensor system.

This circuit constitutes an RF biased SQUID system with commercially available conventional control electronics which provides a relatively low frequency response, up to 50 KHz. Alternative implementations include the use of a DC biased SQUID sensor and/or different electronic implementations to provide response at much higher frequencies and over much wider frequency ranges.

The voltage across resistor 65 is a stochastic signal which includes the signals which are characteristic of the sample being tested. This signal is the input to spectrum analyzer 66 through lines 67 and 68. The spectrum analyzer includes appropriate circuitry and visual display 71, which may be a CRT. The spectrum analyzer is a conventional device, available from several manufacturers. It only needs to have a few basic characteristics and capabilities to handle the signals as described herein. The results of its operation on the input signal from resistor 65 are depicted in FIGS. 5–9 and will now be discussed.

In practice, broadband or white noise will be applied to the sample by stochastic excitation coil 14. The signal all the way through the circuit of FIG. 4 appears the same, with or without a sample being present, and that signal 72 will appear as shown at the SQUID output, $V_{SQ}$, in FIG. 5. This signal can be processed by the spectrum analyzer to provide a useful output on display 71. The signal across resistor 65 is analyzed by using a Fourier Transform, providing the non-sample signal 73 of FIG. 6, which is a measure of the energy in the stochastic signal at each frequency, or energy per unit frequency. For white noise the energy for each frequency will be essentially the same. When sample 35 is positioned in one of detection coils 16 and 17, the Fourier Transform will have the appearance of FIG. 7. The energy plot, signal 74, will reflect energy absorbed from the stochastic excitation by the sample by absorption peak 76. A sample which emits energy at some frequency will show an emission peak, that is, an energy peak in the opposite direction, or upward, with respect to peak 76 in FIG. 7. A sample may absorb or emit multiple peaks at different frequencies, representing different characteristics of the sample.

Figure 8:
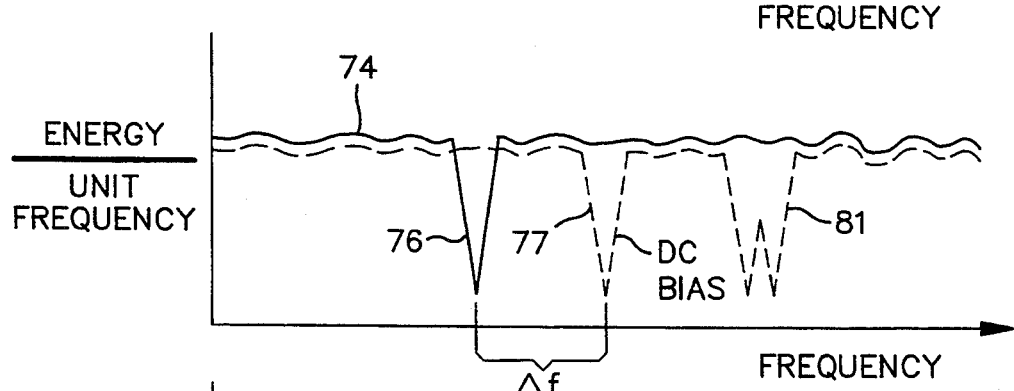
FIG. 8 is the graphic representation of FIG. 7 showing the effect of the DC field of FIG. 2 or 3 applied.
Figure 9:
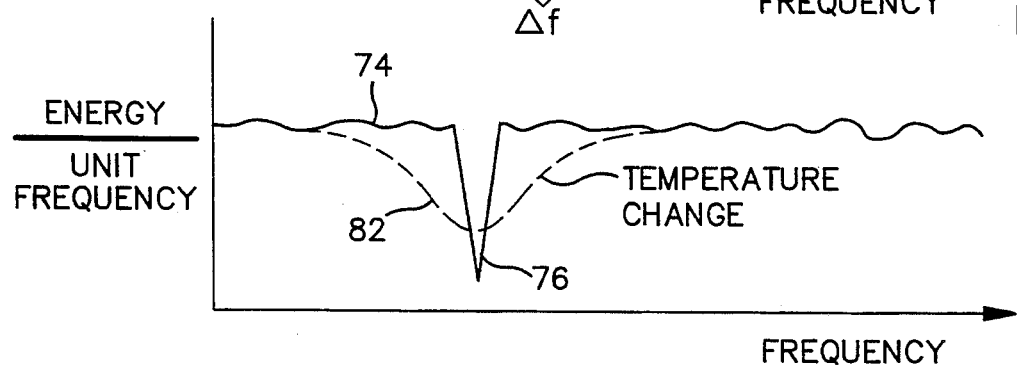
FIG. 9 is the graphic representation of FIG. 7 showing the effect of temperature modification of the sample.

When a magnetic field is applied to the sample, as shown in either FIG. 2 or FIG. 3, the DC field may shift the peak to a different frequency, as indicated by dotted line peak 77 in FIG. 8. The change in frequency, $\Delta f$, is due to the applied magnetic field with $\Delta f$ being changeable by controls 36 or 37. Under some circumstances the emission peak may split into multiple peaks, for example, alternative dotted line peak 81 in FIG. 8. This can provide additional information about the sample. Measurements would likely be made at several different applied DC fields under control 36 or 37 to obtain enhanced information about the sample.

When the temperature of the sample is varied, such as by means of thermal element 38 in FIG. 1, the amplitude or width, or both, of the sample's emission peak or peaks may change. An example of this is shown by dotted line peak 82 in FIG. 9. This externally caused modification of the signal may provide further information about the molecular motions and interactions in the sample. The temperature affected peak may not always have the shape of peak 82, but it will normally be different from peak 76. By taking measurements at several different temperatures as provided by control 39, more and more information about the sample may be available.

In any measurement application where the response of a sample is to be characterized over a large range of frequencies, the system of this invention allows the measurement to be performed with a single measurement comprising all desired frequencies, rather than by a series of separate measurements, each at a single frequency, over the frequency range of interest. By contrast with the prior art which employs a high-power pulse or series of pulses having a well defined frequency applied to the sample, where the sample response is measured at that specific frequency after the pulses have been turned off and using a detector which resonates at the same frequency, the present invention uses to great advantage the broadband, very high sensitivity of the SQUID detection system. Alternatively, similar measurements can be performed using the technique of this invention by applying a much lower power stochastic signal to the sample and detecting the resonant sample response with the SQUID system, without necessarily turning off the excitation signal. Because the SQUID detector has such a large effective bandwidth response with substantially equal sensitivity, the detector of the invention allows a single measurement to characterize the sample over a large range of frequencies. That is, the SQUID sensor responds equally to each characteristic frequency of the sample.

An additional advantage of the invention stems from the large dynamic range of the SQUID detector system. While typical narrow-band systems may have a total dynamic range of 100,000 ($10^5$) times their inherent noise level, this SQUID detection system can have a dynamic range of 10 million ($10^7$) times its inherent noise level. Thus the combination of a stochastic excitation system with this SQUID detection system can allow measurements of the sample response to be conducted with a much greater stochastic excitation, relative to detector sensitivity, being applied to the sample than was previously possible.

In view of the above description, it is likely that modifications and improvements will occur to those skilled in the applicable area of technology, which are within the scope of the accompanying claims. For example, this invention is not limited to NMR measurements, but applies to any sample having single or multiple frequency responses. Also the invention is not limited in the SQUID type with which it will operate. The SQUID may either be a low $T_c$ or a high $T_c$ device, and it may be an RF-biased or DC-biased SQUID. Additionally, the circuit of FIG. 4 operates in a conventional manner. There are other ways to handle the signals from the SQUID detection system. One alternative would be to digitize the data and process it in a computer rather than by a spectrum analyzer.

What is claimed is:

1. A method for obtaining wideband frequency response measurements from a sample, the method comprising the steps of:
   applying to the sample a stochastic magnetic excitation field whereby the frequency components of the excitation field which coincide with the resonant frequencies of the nuclear magnetic moments in the staple generate an oscillating magnetic field in and around the sample;
   sensing the oscillating magnetic field around the sample by means of the current induced in a detection coil closely adjacent to the sample;
   coupling the sensed oscillating current to a SQUID by means of a superconducting input coil in a SQUID sensor; and
   providing the SQUID output signals, which include the characteristic frequency responses from the sample in a superconductive modulation coil, to measurement and analysis apparatus to thereby obtain the frequency response measurements.

2. The method recited in claim 1, wherein the detection coil comprise a pair of counterwound coils connected across the superconducting input coil.

3. The method recited in claim 1, and comprising the further step of converting the signals from the SQUID to an indication signal for analysis.

4. The method recited in claim 1, and comprising the further step of applying a DC magnetic field to the sample while the frequency response measurements are being performed.

5. The method recited in claim 4, wherein the strength of the DC magnetic field applied to the sample is selectively controllable whereby the frequency response of the sample is measured as a function of the magnetic field.

6. The method recited in claim 5, wherein the DC magnetic field is parallel to the excitation field applied to the sample.

7. The method recited in claim 5, wherein the DC magnetic field is perpendicular to the excitation field applied to the sample.

8. The method recited in claim 1, and comprising the further step of subjecting the sample to varying temperatures while the measurements are being performed, whereby the frequency response of the sample is measured as a function of temperature.

9. Apparatus for obtaining frequency response measurements from a sample, said apparatus comprising:
   a stochastic signal source;
   an excitation coil connected to said stochastic signal source, the sample being positioned with respect to said excitation coil so that the magnetic field of said excitation coil is applied to the sample, thereby causing the sample to generate an oscillating magnetic field;
   detection coil means adjacent to the sample such that the oscillating magnetic field from the sample inductively couples to said detection coil, thereby causing currents to flow in said detection coil;
   a superconducting input coil connected to said detection coil means such that the currents flowing in said detection coil also flow in said input coil; and
   a SQUID sensor, said input coil being coupled to said SQUID sensor such that the currents flowing in said input coil cause said SQUID sensor to generate an output voltage where the frequency response of the sample is contained in the oscillating output voltage.

10. The apparatus recited in claim 9, wherein said detection coil means comprises a pair of series connected coils which are counterwound with respect to each other and balanced with respect to said excitation coil so that when no sample is present, a signal from the excitation coil produces substantially no signal in the SQUID detector.

11. The apparatus recited in claim 9, and further comprising means for applying a DC magnetic field to the sample to enable the frequency response of the sample to be measured as a function of the magnetic field.

12. The apparatus recited in claim 11, wherein said DC magnetic field is parallel to the excitation field.

13. The apparatus recited in claim 11, wherein the DC magnetic field is perpendicular to the excitation field.

14. The apparatus recited in claim 9, and further comprising means for applying a selectively variable temperature to the sample to enable the frequency response of the sample to be measured as a function of temperature.

15. The apparatus recited in claim 9, and further comprising means for converting the SQUID output signals to indication signals for analysis.

* * * * *

UNITED STATES PATENT AND TRADEMARK OFFICE
CERTIFICATE OF CORRECTION

PATENT NO.  : 5,343,147
DATED       : August 30, 1994
INVENTOR(S) : RONALD E. SAGER ET AL.

It is certified that error appears in the above-identified patent and that said Letters Patent is hereby corrected as shown below:

Title page, item 54 (title), change "(SAUID)" to --(SQUID)--.

Column 1, line 5, in the title, change "(SAUID)" to --(SQUID)--.

Column 2, line 67, change "systems" to --system--.

Column 4, line 43, after "resonance" insert --,-- (comma).

Column 6, line 19, after "field" insert --,-- (comma).

Column 7, line 34, change "staple" to --sample--.

Signed and Sealed this

Fifteenth Day of November, 1994

BRUCE LEHMAN

Attest:

*Attesting Officer*    *Commissioner of Patents and Trademarks*